(12) United States Patent
Murouchi et al.

(10) Patent No.: US 7,713,439 B2
(45) Date of Patent: May 11, 2010

(54) WHOLLY AROMATIC THERMOTROPIC LIQUID CRYSTAL POLYESTER RESIN COMPOSITION, INJECTION MOLDED ARTICLE THEREOF, AND OPTICAL DEVICE USING THE MOLDED ARTICLE

(75) Inventors: Satoshi Murouchi, Kawasaki (JP); Toshio Nakayama, Kawasaki (JP)

(73) Assignee: Nippon Oil Corporation, Tokyo (JP)

( * ) Notice: Subject to any disclaimer, the term of this patent is extended or adjusted under 35 U.S.C. 154(b) by 0 days.

(21) Appl. No.: 12/225,567

(22) PCT Filed: Mar. 22, 2007

(86) PCT No.: PCT/JP2007/056749

§ 371 (c)(1), (2), (4) Date: Sep. 24, 2008

(87) PCT Pub. No.: WO2007/111361

PCT Pub. Date: Oct. 4, 2007

(65) Prior Publication Data

US 2009/0250662 A1    Oct. 8, 2009

(30) Foreign Application Priority Data

Mar. 24, 2006    (JP) .............................. 2006-083306

(51) Int. Cl.
C09K 19/52    (2006.01)

(52) U.S. Cl. ................. 252/299.01; 430/20; 430/270.1; 428/1.1; 349/1

(58) Field of Classification Search ................... 430/20, 430/270.1; 428/1.1; 349/1; 252/299.01
See application file for complete search history.

(56) References Cited

U.S. PATENT DOCUMENTS 3,865,888 A    2/1975    Akutagawa et al.

2002/0068197 A1    6/2002    Ejiri et al.
2004/0165390 A1    8/2004    Sato et al.
2006/0204456 A1    9/2006    Asakura
2007/0292709 A1*    12/2007    Oishi et al. ................. 428/626
2009/0082499 A1*    3/2009    Nishida et al. .............. 524/195

FOREIGN PATENT DOCUMENTS

| JP | 50-36440 | 5/1975 |
|---|---|---|
| JP | 6 38520 | 5/1994 |
| JP | 9048931 | 2/1997 |
| JP | 09 301715 | 11/1997 |
| JP | 2002 060220 | 2/2002 |
| JP | 2002-92854 | 3/2002 |
| JP | 2004-256673 | 9/2004 |
| JP | 2005-232210 | 9/2005 |
| WO | WO 2004/052786 | 6/2004 |

* cited by examiner

*Primary Examiner*—Geraldina Visconti
(74) *Attorney, Agent, or Firm*—Weingarten, Schurgin, Gagnebin & Lebovici LLP

(57) ABSTRACT

Disclosed is a resin composition produced by melt-kneading a white pigment and a wholly aromatic thermotropic liquid crystal polyester. The resin composition can retain the excellent heat resistance and moldability of the wholly aromatic thermotropic liquid crystal polyester and have a satisfactory level of white light reflectance. The resin composition comprises 35 to 100 parts by weight of a white pigment particle and 100 parts by weight of a wholly aromatic thermotropic liquid crystal polyester, wherein the white pigment particle comprises 3 to 15 mass % of aluminum oxide and 97 to 85 mass % of a white pigment produced by a process including a roasting step and having a surface treated with the aluminum oxide (provided that the sum total of the white pigment and aluminum oxide is defined as 100 mass %). The resin composition can be produced by a process including a melt-kneading step.

8 Claims, No Drawings

US 7,713,439 B2

WHOLLY AROMATIC THERMOTROPIC LIQUID CRYSTAL POLYESTER RESIN COMPOSITION, INJECTION MOLDED ARTICLE THEREOF, AND OPTICAL DEVICE USING THE MOLDED ARTICLE

This application is a §371 national phase filing of PCT/JP2007/056749 filed Mar. 22, 2007, and claims priority to Japanese Application No. 2006-083306 filed Mar. 24, 2006.

FIELD OF THE INVENTION

The present invention relates to a wholly aromatic thermotropic liquid crystal polyester resin composition with excellent reflectance of a specific wavelength light, an injection molded article thereof, and an optical device using the molded article, the optical device particularly using white light-emitting diode (hereinafter referred to as "LED").

BACKGROUND OF THE INVENTION

Optical devices using LED such as a lighting system or display device have been used in a wide range of fields. Such an optical device comprises an LED element mounted on a circuit pattern on a substrate by electrically conductive adhesive, solder or the like with necessary wire connections by wire bonding, and a reflector (reflecting frame) provided around the LED element for enhancing the light utilization rate of LED, and the LED element located within the reflector being sealed by a translucent resin is used. As the white LED, various types are conventionally known, and such LED is generally adapted, for example, to obtain white light by combining a plurality of LEDs of green (G), blue (B), red (R) and the like, or to utilize the effect of wavelength conversion by mixing a fluorescent material to the sealing resin. For the wavelength conversion, blue LED is mainly used, but ultraviolet ray emitting LED is also usable as light source. As the reflector, a molding of a resin composition filled with white pigment particles composed of metal oxide may be used.

The reflector containing such resin composition is requested to have heat resistance to heating process of solder or the like for mounting the LED element on the substrate, heat generation during thermosetting of the sealing resin, heating for connecting an LED device to another member, heating in the use environment of the LED device, or the like, and to maintain a high reflectance during the subsequent period including usage. Further, the white LED is particularly requested to maintain a satisfactory reflectance in an area of 500 nm or less. From this point, a resin composition comprising a thermotropic liquid crystal polyester excellent in heat resistance, particularly, a wholly aromatic thermotropic liquid crystal polyester having a melting point exceeding 320° C. and white pigment has come to be used for the LED reflector (refer to, for example, Patent Documents 1 to 3).

Patent Document 1: Japanese Patent Kohyo Publication No. H6 (1994)-38520
Patent Document 2: Japanese Patent Application Laid-Open No. 2004-256673
Patent Document 3: Japanese Patent Application Laid-Open No. 2005-232210

DISCLOSURE OF THE INVENTION

However, such LED reflector including the wholly aromatic thermotropic liquid crystal polyester has the problem of slightly poor reflectance of 480-nm wave as a reflectance index of white light (hereinafter referred to as "white light reflectance" in the specification), compared with conventionally-used ones including a polyamide-based resin composition.

It is commonly known to use, as the white pigment to be added to the wholly aromatic liquid crystal polyester, white pigment particles composed of a metal oxide having heat resistance to the high treatment temperature and high opacifying strength. Addition of such pigment is generally performed by melt kneading.

Since the metal oxide constituting the white pigment particles is an acidic compound, the wholly aromatic thermotropic liquid crystal polyester is decomposed in the melt kneading process due to continuous application of a large shearing force under coexistence of the acidic compound with the melted wholly aromatic thermotropic liquid crystal polyester, causing reduction in molecular weight, generation of a low-molecular weight component, or the like. This phenomenon is caused similarly also in the plasticizing process for injection molding of the resulting resin composition. The effect of such a phenomenon is considered to be more significant as the melting point of the wholly aromatic thermotropic liquid crystal polyester is higher, since the phenomenon possibly becomes more notable at a higher temperature.

With respect to the effect of the melt kneading process, in production of the resin composition of white pigment and wholly aromatic thermotropic liquid crystal polyester, on the surface reflectance of injection molded article, in particular on the reflectance in use as a reflector component for white LED device, sufficient analysis and investigation of countermeasures have not been performed yet.

The present invention thus has an object to attain a satisfactory white light reflectance, in a resin composition obtained from white pigment particles and wholly aromatic thermotropic liquid crystal polyester through melt kneading process, while retaining excellent heat resistance and moldability of the wholly aromatic thermotropic liquid crystal polyester.

A first aspect of the invention relates to a resin composition, comprising 35 to 100 parts by mass of white pigment particles obtained through surface treatment of 97 to 85% by mass of a white pigment produced by a production process including calcination step with 3 to 15% by mass of aluminum oxide (the total of the both being 100% by mass), and 100 parts by mass of a wholly aromatic thermotropic liquid crystal polyester, the composition being produced through melt kneading process.

In a second aspect of the invention, the white pigment in the resin composition of the first aspect of the invention is titanium oxide ($TiO_2$) obtained by sulfuric acid method.

A third aspect of the invention relates to a molded article having a molding surface with a reflectance of 480 nm wave of 80% or more, which is obtained by injection-molding the resin composition of the first or second aspect of the invention.

Further, a fourth aspect of the invention relates to an optical device using the molded article of the third aspect of the invention as a light emitting device member and/or a reflector.

In a fifth aspect of the invention, the light emitting device in the optical device of the fourth aspect of the invention uses white LED.

EFFECT OF THE INVENTION

According to the present invention, a resin composition which can provide a molded article excellent in white light reflectance can be obtained without impairing the excellent heat resistance and moldability of wholly aromatic thermotropic liquid crystal polyester through a general melt kneading process. Therefore, a reflector using a surface of an injection molded article of this resin composition as a reflecting surface, particularly, a reflector suitable for white LED can be obtained, and a light emitting device having excellent performances can be consequently provided.

BEST MODE FOR CARRYING OUT THE INVENTION

Wholly Aromatic Thermotropic Liquid Crystal Polyester

Although there is not a particular limit on the wholly aromatic thermotropic liquid crystal polyester according to the present invention, its melting point is preferably 320° C. or higher since solder-resisting heat resistance is needed for the use as LED reflector.

For obtaining a wholly aromatic thermotropic liquid crystal polyester having a melting point of 320° C. or higher, it is good to use p-hydroxy benzoic acid in an amount of 40 mol % or more as raw material monomer. In addition to this, other known aromatic hydroxycarboxylic acids, aromatic dicarboxylic acids, and aromatic dihydroxy compounds can be used in appropriate combination therewith. Preferable examples thereof include a polyester obtained only from aromatic hydroxycarboxylic acid such as p-hydroxybenzoic acid or 2-hydroxy-6-naphthoic acid, and a liquid crystalline polyester obtained from such polyester and an aromatic dicarboxylic acid such as terephthalic acid, isophthalic acid or 2,6-naphthalene dicarboxylic acid, and/or an aromatic dihydroxy compound such as hydroquinone, resorcin, 4,4'-dihydroxydiphenyl or 2,6-dihydroxynaphthalene.

Particularly preferred is a wholly aromatic thermotropic liquid crystal polyester obtained by polycondensing 80 to 100 mol % of p-hydroxybenzoic acid (I), terephthalic acid (II), and 4,4'-dihydroxybiphenyl (III) (the total of (I) and (II) being 60 mol % or more) (including derivatives thereof) and 0 to 20 mol % of another aromatic compound polycondensation-reactive with any one of the compounds (I), (II), and (III).

In the production of the wholly aromatic thermotropic liquid crystal polyester, for reducing the melt polycondensation time to reduce the effect of thermal history during the process, acetylation of hydroxyl groups of the monomer is preferably performed prior to melt polycondensation. Further, for simplifying the process, the acetylation is preferably performed by supplying acetic anhydride to the monomer in a reaction tank. The acetylation process is preferably performed using the same reaction tank as in the melt polycondensation process. Namely, it is preferred to perform the acetylation reaction of the raw material monomer with acetic anhydride in the reaction tank, and raise the temperature after completion of the reaction to transfer the reaction system to polycondensation reaction.

The melt polycondensation reaction is performed along with deacetylation reaction of the acetylated monomer. The reaction is preferably performed using a reaction tank including a monomer supplying means, an acetic acid discharging means, a melted polyester extracting means, and a stirring means. Such reaction tank (polycondensation device) can be appropriately selected from conventionally known ones. The polymerization temperature is preferably 150 to 350° C. After completion of the acetylation reaction, the temperature is preferably raised to a polymerization starting temperature to start polycondensation, and then raised to 280 to 350° C. as final temperature at a rate of 0.1° C./min to 2° C./min. As the catalyst of the polycondensation reaction, compounds of Ge, Sn, Ti, Sb, Co, Mn, Mg and the like can be used. The polycondensation temperature rises corresponding to rise of the melting temperature of the produced polymer according to the progress of polycondensation.

In the melt polycondensation, the wholly aromatic thermotropic liquid crystal polyester with low polymerization degree is extracted from the polymerization tank as in the melt state, when its flow point reaches 200° C. or higher, preferably 220 to 330° C., and supplied to a cooler such as a steel belt or drum cooler to cool and solidify it.

The solidified wholly aromatic thermotropic liquid crystal polyester with low polymerization degree is pulverized to a size suitable for the following solid phase polycondensation. Although the method for pulverization is not particularly limited, for example, an impact grinder such as Feather Mill, Victory Mill, Coloplex, Pulverizer, Contraplex, Scroll Mill, or ACM Pulverizer produced by Hosokawa Micron Corporation, Roll Granulator that is a pulverizing grinder mill produced by Matsubo Corporation, or the like can be used. Particularly preferable is Feather Mill by Hosokawa Micron Corporation. In the present invention, the particle size of the pulverized matter is preferably within the range of 4-mesh passable to 2000-mesh impassable by industrial sieve (Tyler mesh), further preferably within the range of 5 mesh to 2000 mesh (0.01 to 4 mm), most preferably within the range of 9 mesh to 1450 mesh (0.02 to 2 mm) although it is not particularly limited thereto.

The pulverized matter obtained in the pulverizing process is supplied to solid-phase polycondensation process to perform solid-phase polycondensation. The apparatus used for the solid-phase polycondensation process and the operation condition thereof are not particularly limited, and known apparatuses and methods can be used. For the use as LED reflector, it is preferred to perform the solid-phase polycondensation reaction until a one having a melting point of 320° C. or higher is obtained.

As the white pigment particles, those obtained through surface treatment of 97 to 85% by mass of a white pigment with 3 to 15% by mass of aluminum oxide (the total of the both being 100% by mass) are used. The white pigment referred to in the present invention is the one not aluminum oxide. Any of the white pigment can be used without particular limitation as long as it has heat resistance to the melt kneading process with the wholly aromatic thermotropic liquid crystal polyester and the injection molding temperature, as well as the heating in solder mounting process or the like.

As the white pigment obtained by a production process including roasting step, titanium oxide ($TiO_2$), zinc oxide (ZnO), white lead ($2PbCO_3.Pb(OH)_2$) and the like are usable. Metal oxide-based white pigments excellent in heat resistance are preferred. Particularly, rutile type titanium oxide with high opacifying strength, which has an average particle size of 0.1 to 0.5 μm, is most preferred. Zinc oxide is also usable depending on the taste of hue.

Of the metal oxide-based white pigments, titanium oxide produced by sulfuric acid method including roasting step is particularly preferred. The present inventors think that a component of the white pigment which undesirably affects the white light reflectance of a molded article of the composition obtained by mixing it with the wholly aromatic thermotropic liquid crystal polyester resin followed by melt kneading can be removed in the roasting step.

As the method for surface-treating the white pigment with aluminum oxide, conventionally known methods can be adapted. For example, any of the method described in Japanese Patent Application Laid-Open No. H5 (1993)-286721 and methods described as conventional methods in this patent document may be used. Although this patent document mainly relates to surface treatment of titanium oxide, the same surface treatment can be performed to other white pigments. The white pigment surface-treated with aluminum oxide is also commercially available. Examples thereof include "SR-1" produced by Sakai Chemical Industry Co., Ltd. (rutile type titanium oxide, average particle size 0.25 μm, surface treatment agent $Al_2O_3$, treatment quantity 5%).

The present inventors think that the amphoteric property (acidic and basic properties) and function as adsorbent of the aluminum oxide are involved in the effect obtained by melt-kneading white pigment particles of the white pigment surface-treated with aluminum oxide ($Al_2O_3$) (including its hydrate) with the wholly aromatic thermotropic liquid crystal polyester.

Namely, they are the function of adsorbing impurities in the polymer and the function of mitigating effects such as promotion of hydrolysis of the wholly aromatic thermotropic liquid crystal polyester by the metal oxide as acidic compound by covering the surface of the metal oxide-based white pigment.

A particularly notable point of the former function is to adsorb an acetic acid-based compound left in the polymer when polycondensation is performed with an acetyl derivative as monomer. Therefore, this effect is most sufficiently exhibited when the acetic acid-based compound is likely to be left within the system, namely when a process for executing melt polycondensation by use of an acetylated derivative of the monomer is included, and further when acetylation of the monomer and melt polycondensation using the resulting acetylated derivative are performed in the same reaction tank.

When the amount of aluminum oxide is 3% by mass or less, the effect of covering the surface of the white pigment and the effect of adsorbing impurities in the polymer cannot be sufficiently exhibited, and when it exceeds 15% by mass, a problem in handling may be caused due to condensation or the like of the white pigment particles. Therefore, as the white pigment particles, those obtained through surface treatment of 97 to 85% by mass of white pigment with 3 to 15% by mass of aluminum oxide (the total of the both being 100% by mass) are used. The particularly preferable range of aluminum oxide is 5 to 10% by mass.

For melt-kneading the wholly aromatic thermotropic liquid crystal polyester with the white pigment particles composed of the white pigment surface-treated with aluminum oxide, methods and apparatuses used for known melt kneading can be suitably used. A single-screw kneading machine, a twin-screw kneading machine, Banbury mixer, pressure kneader and the like are usable, and the twin-screw kneading machine is particularly preferred from the point of ensuring suitable dispersion of the white pigment particles.

The addition amount of the white pigment particles is within the range of 35 to 100 parts by mass to 100 parts by mass of the wholly aromatic thermotropic liquid crystal polyester. When the amount is less than 35 parts by mass, sufficient whiteness cannot be ensured, and when it exceeds 100 parts by mass, moldability is significantly reduced, making it difficult to obtain a molding surface having a white light reflectance of 80% or more.

Known inorganic fillers and organic fillers can be added to the resin composition of the present invention in the range not impairing the effect of the invention. Such fillers may be used alone or in combination of two or more thereof.

Embodiments (Production of Thermotropic Liquid Crystal Polyester: Melt Polycondensation)

To a reaction tank made of SUS 316L (stainless steel) which includes a double helical stirring blade and has an inner volume of 1.7 $mm^3$, p-hydroxybenzoic acid (produced by Ueno Fine Chemicals Industry, Ltd.) 298.3 kg (2.16 kmol), 4,4'-dihydroxy diphenyl (produced by Honshu Chemical Industry Co., Ltd.) 134.1 kg (0.72 kmol), terephthalic acid (produced by Mitsui Chemicals Inc.) 89.7 kg (0.54 kmol), isophthalic acid (produced by A.G. International Chemical Co., Inc.) 29.9 kg (0.18 kmol), and magnesium acetate (produced by Kishida Chemical Co., Ltd.) 0.11 kg and potassium acetate (produced by Kishida Chemical Co., Ltd.) 0.04 kg both as catalyst were charged. After the polymerization tank was nitrogen-substituted through double decompression-nitrogen injection, acetic anhydride 385.9 kg (3.78 kmol) was added thereto, and acetylation reaction was performed for 2 hours in a refluxing state at a stirring blade rotating speed of 45 rpm while raising the temperature to 150° C. in 1.5 hours. After completion of the acetylation, the temperature was raised to 310° C. at a rate of 0.5° C./min in an acetic acid distillation state, and polymerization reaction was performed for 5 hours and 20 minutes while removing acetic acid generated.

The reaction tank system was then sealed and pressurized to 14.7 $N/cm^2$ (1.5 $kgf/cm^2$) with nitrogen, and about 480 kg of a low-polymerization degree wholly aromatic thermotropic liquid crystal polyester that is the melt polycondensation reaction product within the reaction tank was extracted through an extraction port at the bottom of the reaction tank, and supplied to a cooling solidification device described below. The temperature of the melt polycondensation reaction product at this point was 310° C.

(Cooling Solidification Process)

As the cooling solidification device, a device having a pair of cooling rolls 630 mm in diameter with a roll-to-roll distance of 2 mm, and a pair of weirs with a distance of 1800 mm was used according to Japanese Patent Application Laid-Open No. 2002-179979. The pair of cooling rolls was rotated oppositely to each other at a rotating speed of 18 rpm, the fluidized melting polycondensation reaction product extracted from the polycondensation reaction tank was gradually supplied to a recessed part formed by the pair of cooling rolls and the pair of weirs, and retained within the recessed part while adjusting the roll surface temperature by adjusting the flow rate of cooling water within the pair of cooling rolls. The surface temperature of the low-polymerization degree wholly aromatic thermotropic liquid crystal polyester cooled and solidified just after passed through the rolls was 220° C. The resulting sheet-like solidified matter 2 mm in thickness was shredded into about 50-mm squares by a shredder (produced by Nikku Industry Co., Ltd.).

(Pulverization Process and Solid-Phase Polycondensation Process)

The shredded matter was pulverized using Feather Mill by Hosokawa Micron Corporation to thereby obtain a solid-phase polycondensation raw material. The crushed matter was passable through a mesh having 1-mm opening. The crushed matter was stored in a rotary kiln and subjected to solid phase polycondensation under distribution of nitrogen while raising the temperature from room temperature to 170° C. in 3 hours, then to 280° C. in 5 hours, and further to 300°

C. in 3 hours, and about 480 kg of wholly aromatic thermotropic liquid crystal polyester was thereby obtained.

(White Pigment Particle and Other Fillers)

White Pigment Particle 1:

Produced by Sakai Chemical Industry Co., Ltd.: Trade name "SR-1": Rutile type titanium oxide obtained by sulfuric acid method including roasting step, which is surface-treated with aluminum oxide. Average particle diameter: 0.25 μm. Mass % composition ratio of titanium oxide to aluminum oxide equals to 95:5.

White Pigment Particle 2:

Produced by Ishihara Sangyo Kaisha, Ltd.: Trade name "CR-60": Rutile type titanium oxide obtained by chlorine method without roasting step, which is surface-treated with aluminum oxide. Average Particle diameter: 0.21 μm. Mass % composition ratio of titanium oxide to aluminum oxide equals to 95:5

White Pigment Particle 3:

Produced by Sakai Chemical Industry Co., Ltd.: Trade name "R-310": Rutile type titanium oxide obtained by sulfuric acid method including roasting step, which is not surface-treated. Average particle diameter: 0.20 μm.

Glass Fiber:

"PX-1" produced by Asahi Fiber Glass Co., Ltd. (average length: 3 mm, average diameter: 10 μm)

(Production of Resin Composition)

To the wholly aromatic thermotropic liquid crystal polyester, the white pigment particles 1 to 3 and glass fiber were independently mixed in amounts shown in Table 1, and the mixture was melt-kneaded at the highest temperature of the cylinder at 430° C. by a twin-screw extruder (produced by Ikegai) to thereby prepare each pellet.

(Production of Injection Molded Article)

The resulting pellet was made into an injection molded article of 30 mm (width)×60 mm (length)×two-stage thickness (3.0 mm/0.5 mm) (the length of each thickness part being 30 mm) as a specimen for white light reflectance by use of an injection molding machine (SG-25 produced by Sumitomo Heavy Industries, Ltd.) at cylinder temperature 420° C., injection rate 100 m/sec and mold temperature 80° C.

(Measurement of White Light Reflectance)

For a surface of each specimen, measurement of diffuse reflectance to 480-nm light was performed by use of a self-recording spectrophotometer (U-3500: produced by Hitachi, Ltd.). The reflectance is shown as a relative value to 100% diffuse reflectance of a standard white board of barium sulfate. The result is shown in Table 1.

Each of the resin compositions of Examples 1 to 5 and Comparative Examples 1 to 2 had excellent injection moldability. In comparison of Examples 1 to 3 with Comparative Examples 1 to 2, which were differed in that White pigment particle 1 (satisfying the requirement of the present invention) was used in the former as the titanium oxide to be included, while White pigment particle 2 or White pigment particle 3 (not satisfying the requirement of the present invention) was used in the latter, the value of reflectance is apparently higher in the former than in the latter in both specimen thickness conditions of 3.0 mm and 0.5 mm.

In Example 4 in which 50 parts by mass of 75 parts by mass of White pigment particle 2 (not satisfying the requirement of the present invention) contained in Comparative Example 1 was substituted by White pigment particle 1 (satisfying the requirement of the present invention), the value of reflectance is apparently higher than in Comparative Example 1 in both specimen thickness conditions of 3.0 mm and 0.5 mm.

All the compositions of Examples 1 to 4 which satisfy the requirement of the present invention show high reflectance values in both specimen thickness conditions of 3.0 mm and 0.5 mm.

INDUSTRIAL APPLICABILITY

The resin composition of the present invention has an excellent reflectance in addition to excellent heat resistance and injection moldability owned by a liquid crystal polyester resin composition, and can be used as a member which is requested to have a high reflectance such as a light emitting device member and/or a reflector, particularly, a member for a light emitting device using white LED.

The invention claimed is:

1. A resin composition, comprising 35 to 100 parts by mass of white pigment particles obtained through surface treatment of 97 to 85% by mass of a white pigment obtained by a production process including roasting step with 3 to 15% by mass of aluminum oxide (including its hydrate) (the total of the both being 100% by mass), and 100 parts by mass of a wholly aromatic thermotropic liquid crystal polyester, the composition being obtained through a melt kneading process.

2. The resin composition according to claim 1, wherein the white pigment is titanium oxide ($TiO_2$) obtained by sulfuric acid method.

3. A molded article having a molding surface with a reflectance of 480 nm wave of 80% or more, the molded article being obtained by injection-molding the resin composition according to claim 1.

4. An optical device, which uses the melded article according to claim 3 as a light emitting device member and/or a reflector.

TABLE 1

| | Composition (parts by mass) | | | | | Reflectance (%) | |
| --- | --- | --- | --- | --- | --- | --- | --- |
| | Liquid Crystal Polyester | White Pigment Particle 1 | White Pigment Particle 2 | White Pigment Particle 3 | Glass Fiber | Specimen Thickness 3.0 mm | Specimen Thickness 0.5 mm |
| Example 1 | 100 | 75 | | | 15 | 84 | 83 |
| Example 2 | 100 | 90 | | | 0 | 86 | 82 |
| Example 3 | 100 | 75 | | | 5 | 85 | 82 |
| Example 4 | 100 | 50 | 25 | | 15 | 84 | 81 |
| Example 5 | 100 | 50 | | | 15 | 82 | 80 |
| Comparative Example 1 | 100 | | 75 | | 15 | 73 | 70 |
| Comparative Example 2 | 100 | | | 75 | 15 | 75 | 72 |

5. The optical device according to claim 4, in which the light emitting device uses white LED.

6. A molded article having a molding surface with a reflectance of 480 nm wave of 80% or more, the molded article being obtained by injection-molding the resin composition according to claim 2.

7. An optical device, which uses the molded article according to claim 6 as a light emitting device member and/or a reflector.

8. The optical device according to claim 7, in which the light emitting device uses white LED.

* * * * *

UNITED STATES PATENT AND TRADEMARK OFFICE
CERTIFICATE OF CORRECTION

PATENT NO. : 7,713,439 B2
APPLICATION NO. : 12/225567
DATED : May 11, 2010
INVENTOR(S) : Satoshi Murouchi et al.

Page 1 of 1

It is certified that error appears in the above-identified patent and that said Letters Patent is hereby corrected as shown below:

Title page, (75) Inventors, please correct as follows:

"Kawasaki (JP)" should read --Kawasaki-shi (JP)-- (first occurrence);

"Kawasaki (JP)" should read --Kawasaki-shi (JP)-- (second occurrence); and

Column 8, claim 4, line 49, "melded" should read --molded--.

Signed and Sealed this
Twenty-eighth Day of December, 2010

David J. Kappos
*Director of the United States Patent and Trademark Office*